Oct. 5, 1965 D. L. KLEIN ETAL 3,209,450

METHOD OF FABRICATING SEMICONDUCTOR CONTACTS

Filed July 3, 1962

INVENTORS D. L. KLEIN
R. W. MAC DONALD

BY *Arthur J. Torsiglieri*

ATTORNEY

United States Patent Office 3,209,450
Patented Oct. 5, 1965

3,209,450
METHOD OF FABRICATING SEMICONDUCTOR CONTACTS

Donald L. Klein, New Providence, and Robert W. MacDonald, Murray Hill, N.J., assignors to Bell Telephone Laboratories, Incorporated, New York, N.Y., a corporation of New York Filed July 3, 1962, Ser. No. 207,212
1 Claim. (Cl. 29—492)

This invention relates to semiconductor translating devices. More particularly, this invention relates to techniques for bonding together piece parts of a semiconductor device.

There are several requirements for a good bond between piece parts of a semiconductor device that are in apparent conflict. If the device is later to withstand high temperatures, it is important that the bond be able to withstand high temperature without deterioration. This suggests the use of high melting point materials. However, it is advantageous that the bonds be made at temperatures sufficiently low that the electrical properties of the semiconductor element or wafer are not injured. This suggests the use of low melting point materials.

Therefore, an object of this invention is a method of making a bond at a low temperature which cannot be destroyed by exposure to relatively much higher temperatures.

This invention is based on applications of the fact that various alloys, for example, gallium-gold or indium-gold, exhibit a relatively low melting point when the gallium or indium content is high but a relatively high melting point when the gold content is high. As an example of the invention, a gallium layer is sandwiched between two gold plated piece parts and the piece parts bonded together by heating to a temperature in excess of the melting point of gallium and sufficient to cause a redistribution of the gold from the gold layers into the gallium layer and vice versa. Accordingly, the distinct layers of elements in the initial lamellate arrangements, after heating, produce a gold-rich bonding medium which readily withstands temperatures of 900 degrees centigrade.

Accordingly, a characteristic feature of the invention involves providing each of two surfaces to be bonded together with an overlayer of gold or similar material and sandwiching between such surfaces a layer of a material such as gallium or indium which itself has a relatively low melting point but which when alloyed with the materials of the layers on the surfaces being bonded together forms an alloy whose melting point is considerably higher.

Figure 1:
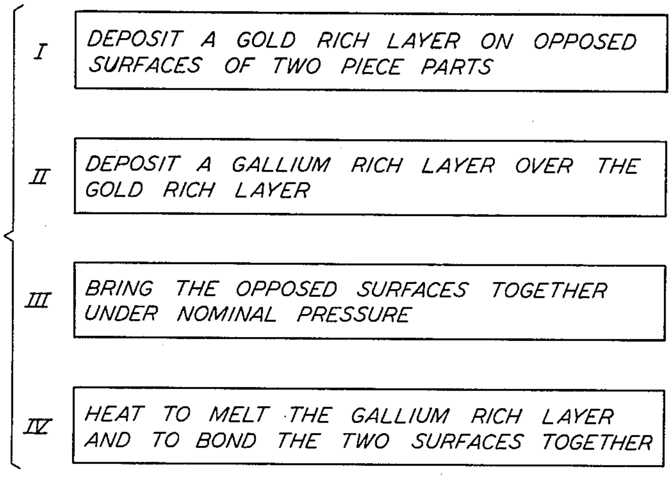
Figure 2A:
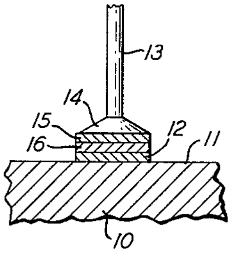
Figure 2B:
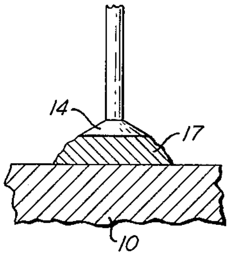
Figure 3A:
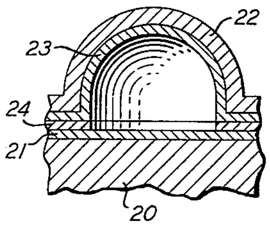
Figure 3B:
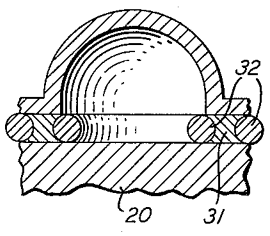

The invention and its further objects and features will be understood more clearly and fully from the following detailed description rendered in conjunction with the accompanying drawing, wherein:

FIG. 1 is a block diagram of the method of this invention in one representative form;

FIGS. 2A and 2B are schematic representations partially in cross section of a lead wire and a surface portion of a semiconductor wafer in a preliminary stage of processing, and bonded, respectively, in accordance with this invention; and FIGS. 3A and 3B are schematic representations of encapsulation piece parts in a preliminary stage of processing, and bonded, respectively, in accordance with this invention.

It is to be understood that the figures are not necessarily to scale, certain dimensions being exaggerated for illustrative purposes only.

In FIG. 1 there is shown a block diagram describing the sequence of steps in accordance with this invention. Block I recites the initial step of coating with a gold-rich layer the opposed surfaces of two piece parts to be bonded together or united. As shown in block II, next, at least one of these layers is coated with an overlayer having a high content of gallium. The opposed surfaces of the piece parts are placed in nominal pressure contact with each other and the resulting structure is heated to above the eutectic temperature of the overlayer for forming a bond as called for in blocks III and IV.

The process of FIG. 1 applied to the uniting of lead wires to semiconductor wafers is described with respect to FIGS. 2A and 2B. Specifically, in FIG. 2A, there is shown the portion 10 of a semiconductor wafer to a portion of whose surface 11 a contact is to be fabricated in accordance with this invention. In the context to FIG. 1, the wafer 10 constitutes one of the piece parts. On surface 11 is shown a layer 12 of gold. Copper lead wire 13 constitutes the second piece part and, for ease of bonding, has an enlarged portion 14 giving the wire a "nailhead" appearance. A coating 15 of gold and coating 16 of gallium overlie portion 14 successively. The figure shows the coated piece parts in abutment. Thus, initially, the contact has distinct layers. However, fusion together and intermingling of the components of the distinct layers results during processing. More specifically, under the influence of heat the gallium and gold of the various distinct layers 12, 15 and 16 shown in FIG. 2A intermix to form an intermetallic gold-rich gallium-gold alloy 17 as shown in FIG. 2B. The thicknesses of the various layers are chosen to insure that the final product will employ as the bonding medium an alloy sufficiently rich in gold that the bond will withstand the temperature required for it.

Gallium has a melting point of 29.78 degrees centigrade. Consequently, at just slightly above room temperature gallium is molten. Thus, eventually, even at room temperature a gold-gallium-gold lamellate contact rearranges itself into a gold-rich gallium-gold alloy as long as there is an excess of gold present.

A general rule of thumb for the comparative speeds of chemical reactions is that for every increase of 10 degrees centigrade the time for the reaction is halved. At 200 degrees centigrade several seconds are required for forming the desired end result in accordance with this invention. At 500 degrees centigrade, one-thirtieth of a second is required. However, at room temperature the time required exceeds 24 hours and is impractical for commercial application. The preferred temperature is at about 500 degrees centigrade where the contact is formed so quickly that the remainder of the device is little affected. The heat is provided conveniently by well known pulse welding techniques.

The mechanical strength of a contact in accordance with this invention depends to a large extent on the initial bond between the gold plating and the piece part onto which the gold is plated. A typical surface of a piece part is abraded unavoidably on a miscroscopic scale to the extent that deposited gold atoms can become mechanically interlocked in the surface resulting initially in a desirable bond between the plating and the surface. Any form of deposition of the gold which provides such mechanical interlocking is satisfactory in accordance with the invention. However, gold preforms are not ordinarily suitable because the required initimate contact of the gold atoms and the condensing surface is not practical and the preform does not easily wet the piece part.

It is not necessary to have an intermediate layer of pure gallium in accordance with this invention. In practice it may be convenient to have a preform as an intermediate layer. In this case, the low melting point of pure gallium allows its use only at reduced temperatures. However, an alloy including a small percentage of gold, advantageously less than two percent gold, forms a suitable preform. In this connection, and throughout the specification, the term "percentage" refers to atomic percent rather than percent by weight.

Greater percentages of gold than two percent can be used in the initial intermediate layer. Since a brief period of exposure to 500 degrees centigrade does not hurt most processed wafers, percentages of gold which produce gallium-gold alloys with melting points of less than 500 degrees centigrade are suitable. The preferred range of gold percentages is less than about 30 percent. However, a percentage of gold less than about 50 percent is suitable as long as percentages of exactly 50 percent and 43 percent gold are avoided. These percentages correspond to the formation of gallium-gold intermetallic compounds which may embrittle the contact structure. Further, a range of from about 75 to 80 percent gold is suitable for processing at less than 500 degrees centigrade. Above 80 percent gold the temperatures required for processing increase quite rapidly into the range which affects the internal geometry of the semiconductor devices.

A preferred embodiment has been fabricated as follows. The starting material was a slice of P-type conductivity silicon about .030 inch in diameter by .005 inch thick. The slice included a concentration of boron and had a resistivity of .005 ohm-centimeter. Fifty milligrams per square inch of gold were plated on one face of the slice by exposing the face to a solution of 20 grams sodium gold cyanide (71 percent gold), 100 grams ammonium citrate, dibasic (balanced with deionized water to make one liter of solution) for ten minutes at 60 degrees centigrade. The opposite face of the wafer included a concentration of arsenic and had a resistivity of 0.15 ohm-centimeter. Fifty milligrams per square inch of gold were deposited on this face by exposing this face of the slice to the same solution as the other face. Each of a pair of copper wires shaped like a nailhead and having a .020 inch diameter with a .030 inch diameter head was coated with 50 milligrams per square inch of gold also by exposing the wire to the same solution as above for seventeen minutes at 65±5 degrees centigrade. Each coated nailhead was plated with 50 milligrams per square inch of gallium by exposing the wire to a solution of ten parts ammonium chloride, ten parts ammonium chlorogallate and 100 parts glycerine by weight for three seconds at 140 degrees centigrade. Fifty grams of pressure were applied in holding each of the plated heads of the thus prepared wire to a different face of the slice. The temperature was raised to about 500 degrees centigrade for about one-thirtieth of a second. Subsequently, the device was heated to a temperature in excess of 500 degrees centigrade for several hours and tested. Each of the lead connections was found firm and the device characteristics were found unimpaired.

In another embodiment of this invention a seal as well as a bond is provided between two portions of a semiconductor encapsulation. Specifically, with reference to FIG. 3A, portion 20 of a Kovar header is plated with gold layer 21 about .0005 inch thick. Similarly, Kovar cap 22 is coated with gold layer 23 about .0005 inch thick. Preform 24 comprising two percent gold and 98 percent gallium also about .0005 inch thick abuts the opposing surfaces of portion 20 and cap 22 as the various parts are stacked. The structure is heated at about 500 degrees centigrade for about one-thirtieth of a second and the structure of FIG. 3B results. It has been found that although the internal region 31 of the formed contact is gold-rich, having less than four percent gallium and over 96 percent gold, there are formed, about the external and internal periphery of the contact, beadings or coatings 32 which are gallium-rich, having up to 99 percent gallium and one percent gold, providing a hermetic seal as well as a strong mechanical bond. Such gallium-rich beadings have melting points far lower than that of the internal gold-rich region. However, if an encapsulation united in accordance with this invention is subjected to a temperature in excess of the melting point of the material of the beading, the beading will be driven quickly thereby toward a gold-rich alloy form solid at that temperature. There has been no indication that the hermetic seal deteriorates under the influence of temperatures in excess of 500 degrees centigrade.

There are various other materials which are suitable in accordance with the invention. Both satisfactory bonds and vacuum seals have been made with one of the gold layers replaced by a copper layer or a copper-rich layer of, for example, gallium-copper alloy. Also, gallium has been replaced by indium. However, the best results are achieved by using gallium and gold as described above. Moreover, successful bonds can be made to any material to which gold (or copper as above) can be deposited. Typical of the piece parts or substrates which can be used are Kovar, silicon, germanium, copper, nickel and various ceramics.

The above described illustrative embodiments are susceptible of numerous and varied modifications, all clearly within the spirit and scope of the principles of the present invention, as will be apparent to those skilled in the art. No attempt has been made here to illustrate exhaustively all such possibilities.

What is claimed is:

A process for bonding together first and second piece parts of a semiconductor device having first and second opposed surfaces respectively, comprising depositing first and second gold layers respectively on said first and second opposed surfaces, depositing on at least one of said opposed surfaces a third layer of a metal selected from the group consisting of gallium and gallium rich gallium-gold alloys, abutting together the thus coated opposed surfaces, and heating at a temperature of about 500 degrees centigrade for a period of a fraction of a second, thereby to bond said piece parts together.

References Cited by the Examiner

UNITED STATES PATENTS

| | | | |
|---|---|---|---|
| 1,640,469 | 8/27 | Ronci | 29—504 |
| 2,527,587 | 10/50 | Smyth | 29—492 X |
| 2,700,623 | 1/55 | Hall. | |
| 2,746,140 | 5/56 | Belser | 29—504 X |
| 2,754,238 | 7/56 | Arenberg | 29—473.1 X |
| 2,859,512 | 11/58 | Dijksterhuis et al. | 29—501 X |
| 3,025,439 | 3/62 | Anderson | 29—472.9 X |
| 3,046,651 | 7/62 | Olmon et al. | 29—510 X |
| 3,055,099 | 9/62 | Plust et al. | 29—501 |
| 3,065,534 | 11/62 | Marino | 29—501 X |

FOREIGN PATENTS

| | | |
|---|---|---|
| 592,733 | 9/47 | Great Britain. |
| 622,071 | 4/49 | Great Britain. |

JOHN F. CAMPBELL, *Primary Examiner.*